(12) United States Patent
Sprung

(10) Patent No.: US 7,925,325 B2
(45) Date of Patent: Apr. 12, 2011

(54) METHOD FOR ACQUIRING CARDIAC IMAGE DATA

(75) Inventor: Katrin Christel Sprung, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 231 days.

(21) Appl. No.: 11/520,091

(22) Filed: Sep. 12, 2006

(65) Prior Publication Data

US 2007/0083106 A1    Apr. 12, 2007

(30) Foreign Application Priority Data

Sep. 16, 2005   (DE) .................. 10 2005 044 336

(51) Int. Cl.
*A61B 5/05* (2006.01)
(52) U.S. Cl. ......................................... 600/413
(58) Field of Classification Search .................. 600/413
See application file for complete search history.

(56) References Cited

U.S. PATENT DOCUMENTS

| | | | | |
|---|---|---|---|---|
| 4,777,957 A | * | 10/1988 | Wehrli et al. | 600/413 |
| 5,655,532 A | * | 8/1997 | Yasugi et al. | 600/413 |
| 6,353,752 B1 | * | 3/2002 | Madore et al. | 600/410 |
| 6,904,306 B1 | | 6/2005 | Wu et al. | |
| 7,047,060 B1 | * | 5/2006 | Wu | 600/410 |
| 2002/0077538 A1 | * | 6/2002 | Saranathan et al. | 600/410 |
| 2003/0069496 A1 | * | 4/2003 | Foo | 600/413 |
| 2005/0069081 A1 | * | 3/2005 | Kokubun et al. | 378/15 |
| 2005/0089133 A1 | * | 4/2005 | Tsuyuki | 378/8 |

FOREIGN PATENT DOCUMENTS

| | | |
|---|---|---|
| EP | 1 286 171 | 2/2003 |
| EP | 1 010 016 | 1/2006 |

OTHER PUBLICATIONS

"ECG-Triggered Snapshot MR Imaging of the Heart," Liu et al, Proceedings of the Computers in Cardiology Meeting, Chicago Sep. 23-26, 1990, IEEE Comp. Soc. Press, vol. Meeting 17, pp. 381-384.

* cited by examiner

*Primary Examiner* — Eric F Winakur
*Assistant Examiner* — Hien Nguyen
(74) *Attorney, Agent, or Firm* — Schiff Hardin LLP

(57) ABSTRACT

In a method and apparatus for acquiring cardiac image data of a subject of examination, in particular in the context of magnetic resonance tomography, a first image acquiring technique is implemented, in which image data acquiring takes place only in a part of the cardiac cycle, and/or not in each cardiac cycle, and a second image acquiring technique is alternatingly implemented, such that the image data acquiring using the second image acquiring technique takes place at times in which image data acquiring using the first image acquiring technique is not occurring.

17 Claims, 2 Drawing Sheets

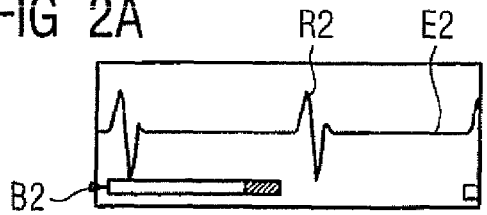
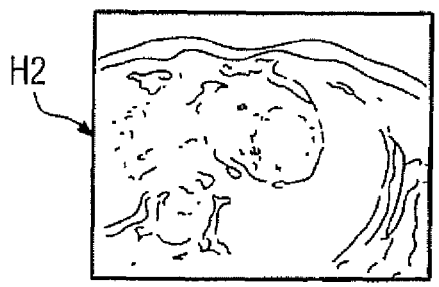
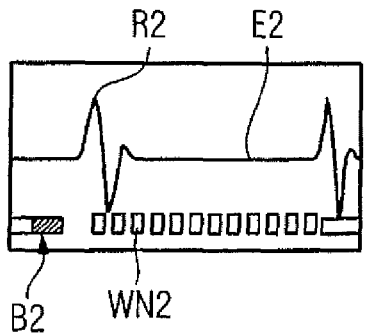
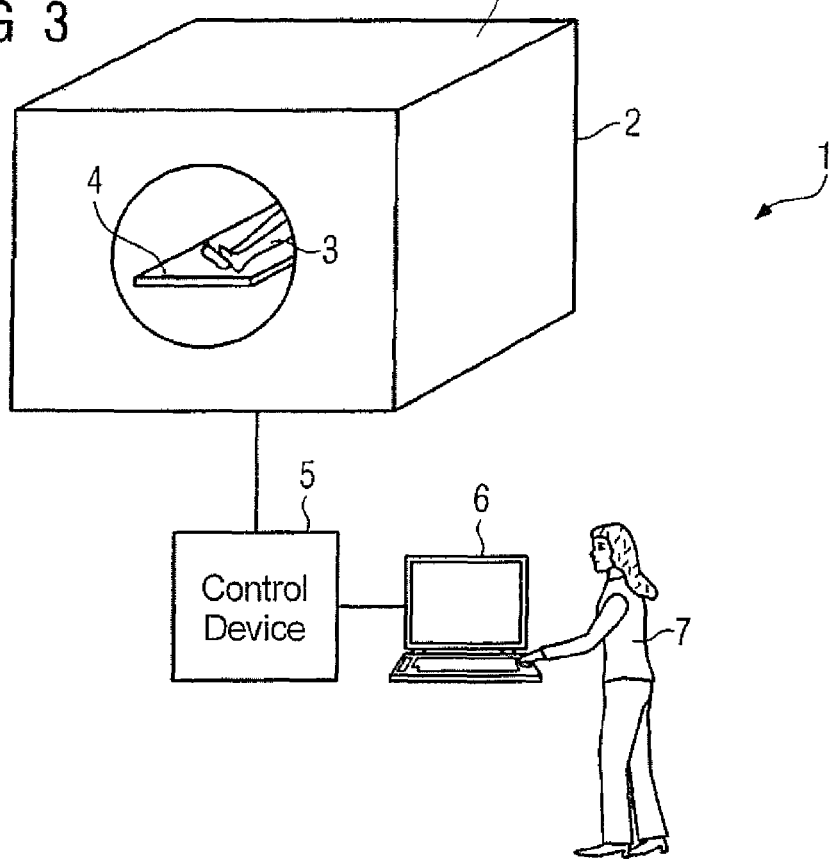

METHOD FOR ACQUIRING CARDIAC IMAGE DATA

BACKGROUND OF THE INVENTION

1. Field of the Invention

The present invention relates to a method for acquiring cardiac image data obtained from an examination subject, in particular in the context of magnetic resonance tomography (MRT).

2. Description of the Prior Art

For acquiring cardiac image data of a human or animal subject, various image acquiring techniques are used in which data are actually acquired only in a small time region of the cardiac cycle. The remaining time is unused during the acquiring, because this time is merely spent waiting for the heart to, for example, return to the desired segment of the cardiac cycle, or for preparation pulses (in the case of MRT) to achieve their effect on the resulting image, or for the tissue to subsequently relax again.

If, for example, images of the myocardium are produced in the context of a morphological imaging, this often takes place only in the end diastolic phase. In addition, there are other image acquiring techniques in which not every heartbeat, but only every second or third heartbeat, is used to produce the image. Examples of this include certain morphology or viability exposures.

The unused time results in long overall examination times that yield a relatively small amount of data.

SUMMARY OF THE INVENTION

An object of the present invention is to provide a method that is improved in this respect for acquiring cardiac image data of a subject of examination, in particular in the context of magnetic resonance tomography.

This object is achieved according to the present invention by a method wherein a first image acquiring technique is employed (applied) in which an image data acquiring takes place only in a part of the cardiac cycle, and/or not in each cardiac cycle, and a second image acquiring technique is employed (applied) such that the image data acquiring using the second image acquiring technique takes place at times in which image data using the first image acquiring technique are not being acquired.

Thus, according to the present invention, parallel to a first image acquiring technique in which the data acquisition takes place only in each nth cardiac cycle, or in particular parts of a cardiac cycle, a second image acquiring technique is used with which image data are acquired in the waiting times, in which data are not being acquired with the first image acquiring technique. "Image data acquiring in a part of the cardiac cycle as used herein encompasses data acquisition in a contiguous part of the cardiac cycle, for example during the end diastole, or data acquisition each of temporally separated segments of the cardiac cycle" for example exposures produced using cine imaging, in which a sequence of exposures is produced.

For addressing certain clinical problems it is necessary to produce cardiac exposures using different techniques, data are acquired from identical slice orientations are multiple times. Thus, for example, initially a first slice orientation is defined and the slice this orientation is acquired using a first acquiring technique A, whereupon a second slice orientation is defined and measurement again takes place using acquiring technique A, etc. Conventionally, the images are subsequently inspected, usually by a physician, whereupon measurements of individual slice orientations are repeated using a second acquiring technique B. The repetition of the measurement of all slice orientations is usually not possible, because this would make the exposure time too long, placing too much stress on the patient. Thus, conventionally, after the inspection of the images a particular slice orientation, for example the second slice orientation, has been copied, a measurement then taking place of this orientation using second acquiring technique B. In addition, further selected slice orientations are copied, and corresponding measurements are carried out using the second acquiring technique.

According to the present invention, this working sequence is simplified because the slice orientations need be defined only once. For example, initially a first slice orientation is defined, and this orientation is measured making parallel use of the first and the second acquiring techniques, exploiting the respective waiting times. Subsequently, a second slice orientation is defined, and a measurement in turn takes place with alternating application of the two acquiring techniques, etc. As a result, all slice orientations are obtained in both acquiring techniques. It is not necessary to forego the diagnostically relevant additional information provided by the second acquiring technique. In addition, the further image inspection after the creation of the slice orientations in the first acquiring technique is omitted, so that a physician is not necessarily required for the image acquiring.

Overall, the use of the second image acquiring technique uses at least some parts of the waiting time, in which measurement does not take place, for a new data acquiring, and the data then produced can be used to create a diagnosis, so that the overall examination time is advantageously shortened for the patient, because separate additional examinations using a second image acquiring technique are not carried out. According to the present invention, the acquiring techniques are thus carried out in alternating fashion, without the acquiring using the one technique having already terminated. This results in a lessening of the stress on the patient due to shorter lying times, for example in a scanner for magnetic resonance examinations, or due to the fact that fewer breathing instructions must be followed. The more effective data acquiring can result in an increase in image data information, so that overall a better diagnosis is possible. The scanner or examination device for acquiring the image data is used more effectively, so that a higher patient is possible.

As the first image acquiring technique, a technique can be used in which the image data acquiring takes place only in the end diastolic phase and/or in every other cardiac cycle. Such techniques are used for example in morphological imaging or in viability measurements. In the production of what are known as dark blood exposures, for example only a small fraction of the cardiac cycle is used for the image data acquiring, while the rest of the time remains unused.

Given use of a first image acquiring technique in which the image data acquiring takes place only in a part of the cardiac cycle, the rest of the cardiac cycle can be completely used for image data acquiring using the second image acquiring technique. Thus, for example, given a first image acquiring technique for acquiring morphological or functional images, in which the data acquiring takes place only in the end diastolic phase or in a limited number of phases, the remaining part of the cycle is used completely for image acquiring using a different image acquiring technique, for example wherein data are acquired using the cine technique at particular predetermined intervals, distributed over all of the rest of the cycle. In this way, for all remaining cardiac phases significant data can be acquired that can be used to create a diagnosis. For example, in this way the phases relevant for the evaluation of the ejection fraction of the heart can be acquired, which make important contributions to a diagnosis.

Given the use of a first image acquiring technique in which the image data acquiring does not take place in each cardiac cycle, at least one of the remaining cardiac cycles can be used completely for image data acquiring using the second image acquiring technique. If for example a morphology measurement is carried out only in every second cardiac cycle, the remaining cardiac cycle is completely available for an image data acquiring, for example using the cine technique, so that in this case additional statements can be obtained concerning an entire cardiac cycle with all possible phases, representing a 100% supplementation of the examination. Here the patient is subjected to a significantly shorter examination time than would be the case given a completely separate acquiring of the morphology data using the first technique in every second cycle as well as the cine data.

The image data acquiring can be controlled by at least one signal of an electrocardiogram, in particular dependent on the R-wave. The typical waves and spikes, as well as stretches, of the electrocardiogram can be used to control, or also to trigger, the image data acquiring. Here, the R-wave is particularly important, which occurs at the time at which the depolarization of the left chamber myocardium begins. This signal is the highest positive deflection in the electrocardiogram, and is correlated chronologically with the end diastole. If this R-wave is recognized, for example by a program for data evaluation, if necessary a preparation for the original measurement technique can be implemented. Subsequently, a scanner for magnetic resonance tomography moves into the waiting time for the original measurement technique. This waiting time is now used for acquiring using the second image acquiring technique. Subsequently, at the provided time the acquiring using the first measurement technique takes place.

According to the present invention, the image data acquiring using the second image acquiring technique can be automatically started and/or ended dependent on the times in the image data acquiring using the first image acquiring technique. For example, it is possible, dependent on a recognition of the end of the first measurement, at least for this cardiac cycle or for a certain length of time, to start the second measurement directly following or with a predetermined interval for a time delay. The second image acquiring technique can also be started or ended dependent on the image data acquiring using the first image acquiring technique in such a way that it is recognized indirectly, by a corresponding signal of the electrocardiogram, that the cardiac phase for the first image acquiring technique, for example the end diastole, has ended, so that an image acquiring using the second technique is possible or desired, and is automatically started.

The image data acquiring using the second image acquiring technique can take place dependent on parameters that are set for the image data acquiring using the first image acquiring technique. The amount of data to be acquired is determined, for example, by the parameters of the first image acquiring technique according to the originally planned measurement, the additional measurement using the second image acquiring technique being adapted to these conditions. In addition, the dependence on the parameters for the image data acquiring using the first image acquiring technique can be such that the image data acquiring using the second acquiring technique is carried out such that the most effective possible supplementation of the two data sets is achieved.

According to the present invention, tomograms can be acquired using the first and the second image acquiring technique. Typically, the image data acquired using the two different acquiring techniques are acquired using the same imaging examination apparatus, for example during an examination using a magnetic resonance tomography apparatus, but this is not necessary, and different medical examination apparatuses can be used in parallel. In this way, tomograms are produced that, as images made using the first and the second image acquiring techniques, are available for a subsequent diagnosis formation. The images created using the second image acquiring technique can in some circumstances replace an additional examination that is usually routinely carried out.

The tomograms can be acquired at least partly with identical slice positioning and/or in slices that run in parallel. Exposure with identical slice positioning is to be recommended if for example a clear clinical problem is present, or it is ensured that the two image acquiring techniques will not cause mutual disturbances to occur. Acquiring in slices in parallel is for example effective if the second image acquiring, or a stimulation for the additional acquiring technique, would disturb a preparation or a relaxation of the tissue that is to be exposed.

In at least one image acquiring technique, a sequence of individual cardiac phase images can be acquired. In this technique, known as cine imaging, a number of cardiac phase images are acquired at particular time intervals, so that afterwards a time-resolved overview of one or more individual cardiac phases is provided, which can be viewed as a video sequence if necessary.

When acquiring individual cardiac phase images in the context of an image acquiring technique, the individual images can be exposed at predetermined intervals, in particular every 25 to 30 ms, or every 50 ms. Measurement in the shortest possible time segments is to be sought, to the extent that this is possible technically or for the patient. Depending on the desired precision of detail, exposure at shorter time intervals than stated above, or exposure using variable intervals, for example according to the current phase of the electrocardiogram, is also possible. For example, data acquiring using a second image acquiring technique can take place every 50 ms until an end diastolic cardiac cycle is reached for which it was planned to use the originally planned measurement technique. The supplementary data acquiring is then interrupted, and acquiring continues using the original image acquiring technique.

According to the present invention, the acquired image data can be displayed and/or evaluated with a program. A program can be used that creates images directly from the acquired image data, which can then be displayed to an operator, who thereupon creates a report or makes a decision as to further image exposures. In addition, the image data can be evaluated with the aid of a program means that for example automatically creates a report which is then provided to a physician, or that alerts evaluating personnel to the presence of anomalies, for example using access to knowledge-based systems or databases containing medical information. The program means can also be a program system that has various components that are fashioned for the purpose of processing data acquired using different techniques, or that are to be used to clarify different clinical problems.

In addition, the present invention relates to an imaging medical examination device that is fashioned in order to execute the above-described method. The imaging medical examination device is fashioned for image data acquiring using, for example, magnetic resonance tomography and/or another method, and therefore includes a magnetic resonance device and, if necessary, another device for acquiring image data. In addition, means for acquiring an electrocardiogram are advantageously present in order to use the signals of the electrocardiogram to control a acquiring of data. Thus, in a first image acquiring technique an image data acquiring takes place dependent on a triggering by the electrocardiogram, and, after the termination of this image data acquiring, in a second technique the waiting time until the first exposure using the originally planned measurement technique is used for additional collection of data. Here, the data acquiring is carried out automatically dependent on operator inputs, and with access to corresponding acquiring protocols contained in a control device of the medical examination device.

Thus it is possible, within the measurement time that was originally provided only for a single image acquiring technique, to obtain additional data by making use of waiting times, these data being used in addition to the data acquired using the first acquiring technique to create a diagnosis, and, if necessary, even to replace additional examinations, such as for example cine measurements that would routinely be carried out.

DESCRIPTION OF THE DRAWINGS

FIG. 2A schematically illustrates an electrocardiogram with acquiring times limited to every other cardiac cycle, as a first image acquiring technique in accordance with the invention.

FIG. 2B schematically illustrates a cardiac exposure acquired according to FIG. 2A.

FIG. 2C schematically illustrates the use of the waiting time in FIG. 2A to implement a second image acquiring technique in accordance with the invention.

FIG. 3 shows an imaging medical examination device according to the present invention.

DESCRIPTION OF THE PREFERRED EMBODIMENTS

Figure 1A:
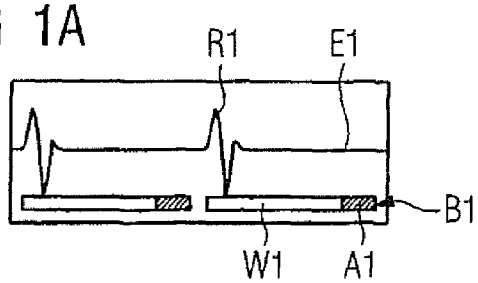
FIG. 1A schematically illustrates an electrocardiogram with acquiring times limited to a part of the cardiac cycle, a first image acquiring technique in accordance with the invention.
Figure 1B:
FIG. 1B schematically illustrates a cardiac exposure acquired according to FIG. 1A.

FIG. 1A shows a sketch of an electrocardiogram E1; two cycles are shown with their respective R-spikes R1. Below electrocardiogram E1, time bars B1 are shown that symbolize the elapsing of time and that each have a long waiting time W1 in which no image data are acquired, followed by, in the end diastole, a relatively short acquiring time A1. Waiting time W1 makes up by far the longest part of the cardiac cycle, which accordingly remains unused for acquiring data. FIG. 1B shows a sketch of a heart exposure H1 corresponding to FIG. 1A that was created from image data acquired in the end diastolic phase. A limitation to the first image acquiring technique having the short exposure time window A1 thus yields only a limited amount of data that can be used to create a diagnosis.

Figure 1C:
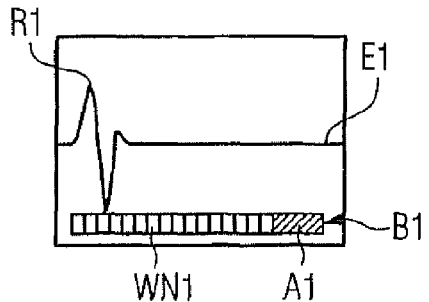
FIG. 1C schematically illustrates the use of the waiting time of FIG. 1A to implement a second image acquiring technique in accordance with the invention.

FIG. 1C shows a sketch for the use of waiting time W1 of FIG. 1A, using a second image acquiring technique according to the method of the present invention. A sketch of electrocardiogram E1 is again shown, but here only a single cardiac cycle is shown. Time bar B1 accompanying electrocardiogram E1 now shows, besides acquiring time A1, a used waiting time WN1, in which data for the individual cardiac phases are produced at particular time intervals using a second image acquiring technique (cine technique) in order to create a functional representation of the heart. These data are thus made available without a prolongation of the examination time, in addition to the image data acquired using the first acquiring technique during acquiring time A1, and can replace further examinations if necessary. Thus, the device for creating cardiac exposures H1, such as that shown in FIG. 1B, can be used more effectively, because more patients can be examined in a shorter time.

Figure 1D:
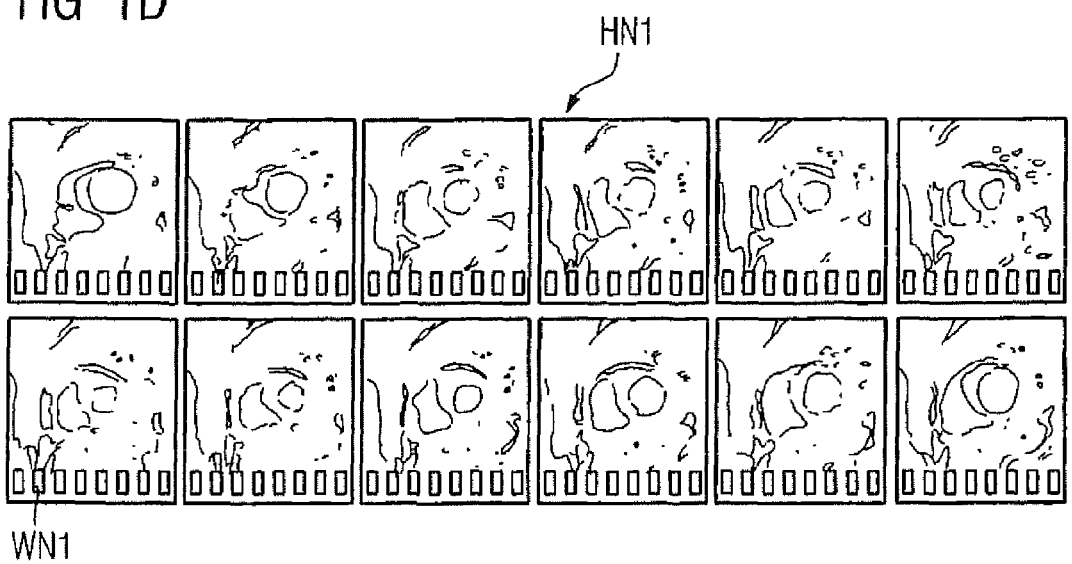
FIG. 1D schematically illustrates cardiac exposures made using the second image acquiring technique/

The second image acquiring technique creates a sequence of cardiac exposures HN1, shown in FIG. 1D. This takes place in the waiting time, which in the first acquiring technique is without measurements, as is indicated by the bar representation of the used waiting time WN1 for cardiac exposures HN1. Thus, in certain time segments determined by acquiring protocols and user settings specific to the technique, additional image exposures are produced that do not extend over the entire cardiac cycle but that can nonetheless be used for the evaluation of the image data with respect to a possible diagnosis. In the case shown, they include the phases that are relevant for the evaluation of the ejection fraction of the heart, and can be loaded into a program means for further evaluation. Thus, overall, instead of one measurement result from a first acquiring technique, two measurement results created by completely different acquiring techniques are provided that can be additionally evaluated.

FIG. 2A shows another sketch of an electrocardiogram E2, in which R-spike R2 can again clearly be seen. Time bar B2 shows that in this case only every second cardiac cycle is used for the acquiring of image data, so that there results a waiting interval, covering a complete cardiac cycle, between individual bars B2 for every other cycle.

A cardiac exposure H2 made using the first acquiring technique, as applied according to FIG. 2A in every other cardiac cycle, is shown in FIG. 2B.

FIG. 2C shows the use according to the present invention of the waiting time in FIG. 2A through the application of a second image acquiring technique; electrocardiogram E2 is again shown, underneath which, besides time bar B2, a used waiting time WN2 is shown. In this used waiting time WN2, cine imaging is used to acquire image data at determined time intervals in the range of a few tens of milliseconds; these data cover a complete cardiac cycle and thus represent a 100% supplementation of the examination with respect to the diagnostic findings.

FIG. 3 shows an imaging medical examination device 1 according to the present invention, e.g. a magnetic resonance (MR) apparatus having, in addition to an image acquiring device 2 into which a patient 3 lying on a patient table 4 is pushed, a control device 5 that controls the image acquiring operation of image acquiring device 2. In addition, an image output means 6, having an input device for operation by an operator 7, is connected to control device 5.

In addition, imaging medical examination device 1 has means (not shown) for acquiring an electrocardiogram whose signals are used in the controlling of the image acquiring. With the operation of the control device 5, after the selection of a corresponding acquiring protocol at image output means 6 by operator 7, the image acquiring takes place, the image acquiring being carried out in a first and in a second image acquiring technique in parallel through alternating application of the two techniques. The wait times in the first image acquiring technique are used to acquire image data using the second image acquiring technique.

The image data acquiring is controlled by the signals of the electrocardiogram, an automatic starting of the image data acquiring using the second image acquiring technique taking place in the waiting time periods of the first technique; for this purpose, control device 5 uses a program means to which it has access. The image data acquiring using the second technique is in turn automatically ended when the associated cardiac phase ends, or when the acquiring using the first technique is supposed to begin (or begin again). Each of the image acquiring techniques acquires tomograms; the tomograms acquired using the second image acquiring technique can each be acquired in a slice that executed in parallel, in order to avoid disturbances of the two image acquiring techniques, for example during preparations due to pulses or the like, or due to the relaxation of a tissue.

Thus, using the imaging medical examination device 1, the time available for data acquisition can be used optimally to obtain additional data using a second image acquiring technique, these additional data being available for evaluation, with the assistance of the control device 5, in order to produce a diagnosis, so that additional, separate examinations may be prevented. This results in a reduction of stress on patient 3, whose time spent lying in image acquiring device 2 is shortened, and who accordingly must follow fewer breathing instructions and the like.

Although modifications and changes may be suggested by those skilled in the art, it is the intention of the inventor to embody within the patent warranted hereon all changes and modifications as reasonably and properly come within the scope of her contribution to the art.

I claim as my invention:

1. A method for acquiring cardiac image data from an examination subject, comprising the steps of:
    interacting with an examination subject using a non-ciné first image acquisition technique, selected from the group consisting of image techniques that obtain a morphological image of the examination subject and techniques that obtain a functional image of the examination subject, to acquire cardiac image data forming a first tomogram only during a portion of a cardiac cycle, and/or not in every cardiac cycle;
    in alternation with said first image acquisition technique, interacting with the examination subject with a second image acquisition technique, that is a ciné technique, to acquire cardiac image data forming a second tomogram at times in which image data acquisition using the first image acquisition technique is not occurring; and
    acquiring said image data forming said first tomogram with a slice position, and acquiring said image data forming said second tomogram with the same slice positioning.

2. A method as claimed in claim 1 comprising employing a magnetic resonance imaging technique as at least one of said first image acquisition technique and said second image acquisition technique.

3. A method as claimed in claim 1 comprising, as said first image acquisition technique, employing an image acquisition technique wherein image data acquisition occurs only in an end diastolic phase of a cardiac cycle, and/or in every other cardiac cycle.

4. A method as claimed in claim 1 wherein, in said first image acquisition technique, image data acquisition occurs only in said portion of said cardiac cycle, and using an entirety of a remaining portion of said cardiac cycle for image data acquisition using said second image acquisition technique.

5. A method as claimed in claim 1 comprising, in said first image acquisition technique, image data acquisition does not occur in every cardiac cycle, and using at least one cardiac cycle in which image data acquisition does not take place using said first image acquisition technique, exclusively for image data acquisition using said second image acquisition technique.

6. A method as claimed in claim 1 comprising acquiring an electrocardiogram from the examination subject, and controlling image data acquisition in at least one of said first image acquisition technique and said second image acquisition technique using a predetermined characteristic of said electrocardiogram.

7. A method as claimed in claim 6 comprising using the R-wave as said predetermined characteristic of said electrocardiogram.

8. A method as claimed in claim 1 comprising automatically starting and/or ending image data acquisition in said second image data acquisition technique dependent on a time of image data acquisition using said first image acquisition technique.

9. A method as claimed in claim 1 comprising identifying image acquisition parameters used for image data acquisition in said first image acquisition technique, and acquiring said image data in said second image acquisition technique dependent on at least one of said parameters.

10. A method as claimed in claim 9 comprising acquiring further tomograms in said first image acquisition technique of slices of said examination subject that are geometrically parallel to slices in said examination subject of which tomograms are acquired in said second image acquisition technique.

11. A method as claimed in claim 1 comprising, in at least one of said first image acquisition technique and said second image acquisition technique, acquiring a sequence of cardiac images respectively of different cardiac phases.

12. A method as claimed in claim 1 comprising recording said images at predetermined intervals.

13. A method as claimed in claim 12 comprising acquiring said images at every 25 to 30 ms as said predetermined intervals.

14. A method as claimed in claim 12 comprising acquiring said images every 50 ms, as said predetermined intervals.

15. A method as claimed in claim 1 comprising representing and/or evaluating the image data acquired in each of said first image acquisition technique and said second image acquisition technique using a computer program.

16. A medical imaging apparatus comprising:
    an imaging system adapted to interact with an examination subject to acquire tomographic image data therefrom; and
    a control unit that controls said medical imaging system to acquire said tomographic image data from the examination subject by operating said medical imaging system with a non-ciné first image acquisition technique, selected from the group consisting of image techniques that obtain a morphological image of the examination subject and techniques that obtain a functional image of the examination subject, to acquire cardiac tomographic image data forming a first tomogram only in a subpart of a cardiac cycle of the examination subject, and/or not in every cardiac cycle of the examination subject, and by operating said medical imaging system with a second image acquisition technique, that is a ciné technique, in alternation with said first image acquisition technique, to acquire cardiac tomographic image data forming a second tomogram at times in which acquisition of tomographic image data is not occurring in said first image acquisition technique; and
    said control unit causing said image data forming said first tomogram to be acquired with a slice positioning, and causing said image data forming said second tomogram to be acquired with the same slice positioning.

17. A medical imaging apparatus as claimed in claim 16 wherein said medical imaging system is a magnetic resonance tomography system.

* * * * *